(12) United States Patent
Shannon et al.

(10) Patent No.: US 7,569,435 B2
(45) Date of Patent: Aug. 4, 2009

(54) TRANSISTOR MANUFACTURE

(75) Inventors: John M. Shannon, Whyteleafe (GB);
Carl Glasse, Redhill (GB); Stanley D. Brotherton, Forest Row (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 350 days.

(21) Appl. No.: 10/597,252

(22) PCT Filed: Jan. 21, 2005

(86) PCT No.: PCT/IB2005/050249

§ 371 (c)(1),
(2), (4) Date: Jul. 18, 2006

(87) PCT Pub. No.: WO2005/071753

PCT Pub. Date: Aug. 4, 2005

(65) Prior Publication Data

US 2008/0224184 A1    Sep. 18, 2008

(30) Foreign Application Priority Data

Jan. 24, 2004  (GB) ................... 0401579.8

(51) Int. Cl.
*H01L 21/00* (2006.01)
(52) U.S. Cl. ............... 438/151; 438/160; 257/E21.414; 257/E29.117
(58) Field of Classification Search ................ 438/151, 438/160
See application file for complete search history.

(56) References Cited

U.S. PATENT DOCUMENTS

| 5,441,905 A * | 8/1995 | Wu ........................ 438/160 |
| 5,801,398 A * | 9/1998 | Hebiguchi ................. 257/66 |
| 2003/0178629 A1* | 9/2003 | Yagi ......................... 257/87 |
| 2003/0219935 A1* | 11/2003 | Miyairi et al. ............ 438/166 |

* cited by examiner

*Primary Examiner*—Alexander G Ghyka

(57) ABSTRACT

A method of making a source-gated transistor is described, in which a gate (4) is provided on substrate (2) followed by gate insulator (6) and semiconductor layer (8). The layer is patterned to align the source with the gate (4) using photoresist (12) and back illumination through the substrate (2) with the gate (4) acting as a mask. The distance between source and drain may also be self-aligned using a spacer technique.

10 Claims, 4 Drawing Sheets

TRANSISTOR MANUFACTURE

The invention relates to a method of manufacturing transistors and to transistors manufactured by the method.

The method is particularly concerned with the manufacture of source-gated transistors of the type described in Shannon and Gerstner, "Source-gated Thin-Film Transistors", IEEE Electron Device Letters, Volume 24, No. 6, June 2003.

Such a transistor is illustrated schematically in FIG. 1. A gate electrode 100 is separated from semiconductor layer 106 by gate insulator 102. A source electrode 110 makes a Schottky barrier with the semiconductor layer 106, and a drain electrode 104 is laterally spaced from the source 110. is The structure is arranged on substrate 108.

Instead of using the field effect to modulate the conductance of a channel between two ohmic contacts, as in a conventional thin film transistor (TFT) the flow of carriers is restricted using the Schottky barrier at the source 110. The barrier height is modulated using the gate 100 overlapping the barrier, and this modulation changes the flow of carriers between source 110 and drain 104.

Such transistors have several benefits over conventional thin film transistors. They have a much smaller saturation voltage which reduces power dissipation and a much higher output impedance which increases device gain.

Thin film manufacturing does not in general achieve the same low feature sizes as achieved in single crystal semiconductor manufacture, because in general there is a need to pattern large areas sometimes with substrates which are not perfectly flat, which makes optical patterning much more difficult.

There is a need for an effective manufacturing method to manufacture such transistors.

According to the invention there is provided a method of manufacturing a source-gated transistor, including:

(a) providing a transparent substrate;

(b) depositing a gate layer and patterning the gate layer to form a gate;

(c) depositing a gate insulating layer;

(d) depositing a thin film semiconductor layer;

(e) depositing a source layer defining a barrier with the semiconductor layer, using a step of back exposure through the substrate using the gate as a mask to define the extent of the barrier between the source layer and the semiconductor layer.

The use of back exposure reduces the number of masks used and thus improves the ease with which the device can be manufactured. Further, alignment of source and gate is automatically achieved without requiring registration of a number of masks.

In a typical arrangement the source material is transparent and the step of back exposure through the substrate using the gate as a mask to define the barrier between source layer and the semiconductor layer includes depositing photoresist on the transparent source layer and exposing the photoresist by illumination through the substrate, gate insulator, semiconductor layer and transparent source layer using the gate as a mask.

However, In alternative arrangements an insulating layer can be deposited on the semiconductor layer and a window in the insulating layer patterned using back exposure in alignment with the gate, as an alternative or addition to patterning the source layer directly.

The method may include defining a drain region in the semiconductor layer in contact with a drain contact; wherein spacers are used to define the lateral extent of a spacer region of the semiconductor layer in registration with the gate using a self-aligned process, the spacer region being the region between the drain region and the barrier.

In this way the length of the spacer region between the barrier and the drain region can be arranged to be as short as possible, in embodiments less than the minimum design rule distance of the process employed. Thus, it is possible to achieve very short lateral spacing of the drain contact region to the gate, less than 1 µm, typically 0.25 to 1 µm. This allows maximum current handling whilst minimising the gate-drain capacitance and drain resistance.

The method may further comprise defining field relief region or regions at the edge of the source in registration with the gate using a self-aligned back exposure process in which the field relief region or regions are patterned using photoresist on the top of the substrate exposed with illumination passing through the substrate using the gate as a mask.

In this way field relief can be provided at the edge of the source reducing the risk of breakdown when significant voltages are applied to the source.

In a particular embodiment the field relief region or regions can be patterned in a self-aligned manner using spacers.

In embodiments the method includes the steps of:

(e) depositing a transparent source layer for forming a barrier at the interface between the transparent source layer and the semiconductor layer;

(f) depositing a positive photoresist layer;

(g) exposing the positive photoresist layer through the transparent substrate and source layer using the gate as a mask to pattern the photoresist in self-alignment with the gate;

(h) etching the transparent source layer to form a source region using the pattern defined directly or indirectly by the photoresist layer;

(i) forming spacers at the edge of the source region either before, after or during step (h);

(j) implanting dopants into drain regions of the semiconductor layer using the source region and spacers as a mask to form highly doped drain regions spaced from the source region by the width of the spacers.

The method may include depositing an insulating layer after step (d) of the depositing the semiconductor layer; and etching the insulating layer to form a source window in alignment with the mask.

The method may include depositing a transparent sacrifical layer on the transparent source layer before carrying out steps (f) and (g) of depositing and patterning the positive photoresist layer; after carrying out step (g), forming spacers on the sidewalls of the transparent sacrificial layer so that the spacers and transparent sacrificial layer are together wider than the gate; and using the transparent sacrificial layer and spacers as a mask to etch the source layer and the underlying insulating layer to leave the source layer extending over a region wider than the gate and to form the insulating layer to define a field plate spacer between the source layer and the semiconductor layer. In this way the source layer is patterned indirectly by the photoresist.

In particular, step (i) of forming spacers may be carried out after step (h) of forming the source region so that the spacers are formed on the edges of the source region.

An implant may be made into the semiconductor layer after step (h) of forming the source regions to form a doped region of the semiconductor layer in alignment with the source.

The method may further Include performing a barrier-lowering implant in the semiconductor layer. This allows the height of the barrier and hence the properties of the finished semiconductor to be controlled.

In a particularly preferred arrangement, the barrier lowering implant is self-aligned to the gate but implanted over a narrower area than the area of the gate defining a field relief region of the central region around the barrier lowering Implant which is not implanted with the barrier lowering implant. This field relief region can provide additional field relief and hence still further reduce the risk of device breakdown.

In embodiments, the method may further comprise depositing a transparent insulating layer in the central region of the barrier between the source and semiconductor layer. This prevents transit over the barrier in the central region ensuring that electrons are injected at the edge. This can in turn reduce parasitic source capacitance and source transit times, speeding the device up.

The invention does not just relate to the method but also to the device thus formed. Accordingly, in another aspect there is provided a transistor comprising:

a transparent substrate;
a gate on the substrate;
gate insulator on the gate;
a semiconductor layer over the gate;
a source extending along the semiconductor layer defining a barrier at the interface between source and semiconductor layer overlapping the gate;
a heavily doped drain region of the semiconductor layer; and
self-aligned spacers or field relief regions defining a lateral separation between the drain region and the barrier.

For a better understanding of the invention, embodiments will now be described, purely by way of example, with reference to the accompanying drawings, in which.

Note that the embodiments are not to scale and purely schematic. Further, note that like reference numerals are used for the same or similar features in different figures.

Referring to FIGS. 2 to 6, a method of making a source-gated transistor according to a first embodiment of the invention will now be described.

A transparent substrate 2, in the embodiment of glass but which could also be of transparent plastics or other transparent material, is covered with a layer of gate metal 4. The gate metal may be, for example, 100 nm thick Cr or heavily doped polysilicon. The gate metal layer 4 is patterned using photoresist patterned with a first mask as will be known to those skilled in the art.

Figure 1:
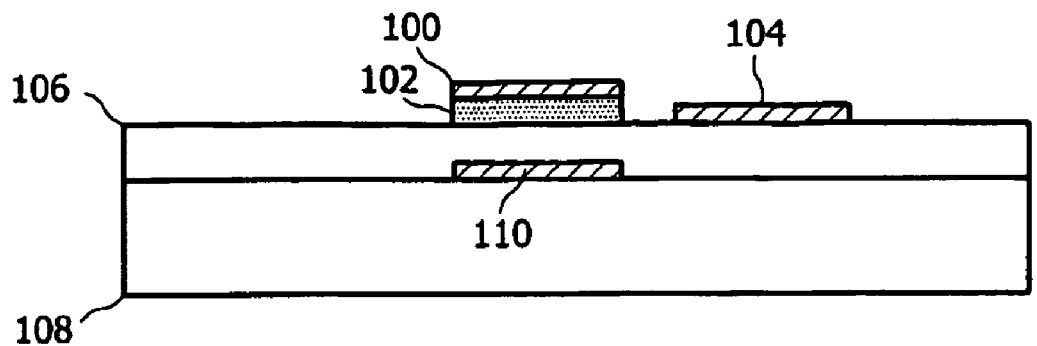
FIG. 1 shows a schematic of a Source-Gated Transistor in accordance with the paper by Shannon and Gerstner.
Figure 2:
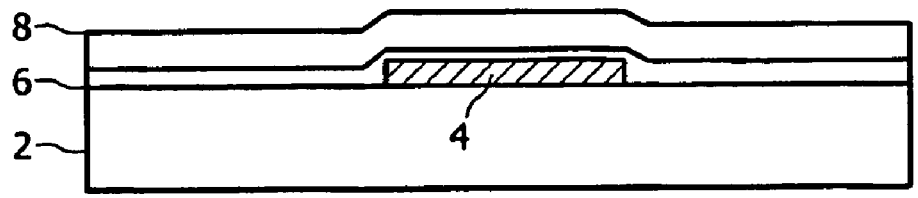
FIG. 2 is a schematic of a first step in the manufacture of a transistor according to a first embodiment of the invention.
Figure 3:
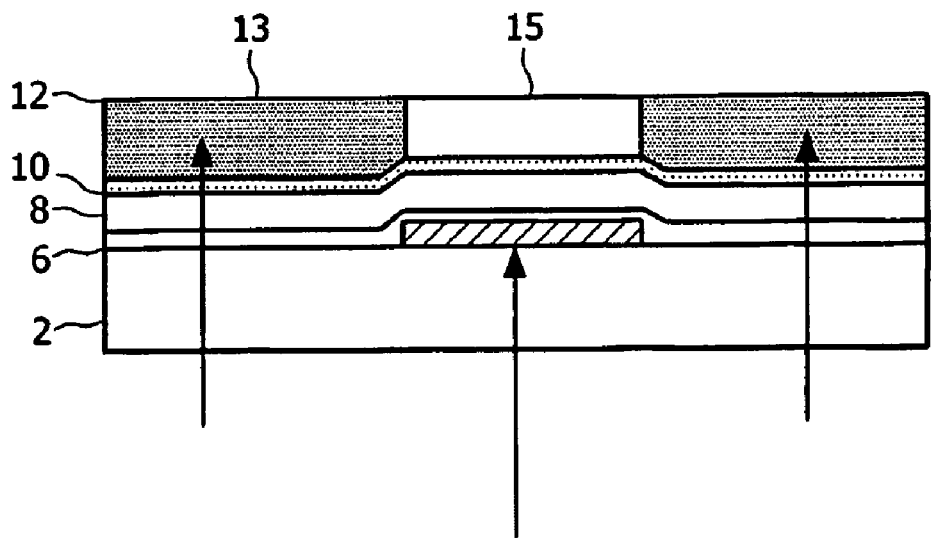
FIG. 3 is a schematic of a second step in the manufacture of a transistor according to the first embodiment of the Invention.

Then, a layer of silicon dioxide 6 to act as the gate insulator is deposited, followed by a thin film layer of polysilicon 8 to act as the active transistor layer, arriving at the structure illustrated in FIG. 2.

Next, an insulating layer 10 is deposited—this layer will in the finished transistor form the field plate—followed by negative photoresist 12. The photoresist 12 is patterned by illumination through the substrate using the gate 4 as a mask, as illustrated schematically by the arrows in FIG. 3 which show the direction of illumination. The photoresist is shown shaded in exposed region 13 and clear in unexposed region 15.

The negative photoresist 12 is developed, which removes the photoresist 12 from the unexposed region 15. The insulating layer 10 is etched using photoresist 12 leaving a source hole 14 in the insulating layer 10 that is self-aligned to the gate. An implant 16 into the polysilicon 8 to control s the barrier height may at this point be made, as will be described below with reference to the third embodiment.

Next, transparent source layer 18 of metal that forms a Schottky barrier at its interface with the polysilicon layer 8 is deposited over the substrate followed by sacrificial transparent insulating layer 20. Suitable metals include indium tin oxide and other transparent metals. Positive photoresist 22 is then deposited and patterned using back-exposure through the substrate 2 again using the gate 4 as a mask.

It will be appreciated that the source layer 18 and sacrificial insulating layer 20 need only be transparent enough to allow the illumination used in patterning the photoresist 22 to pass through these layers to the photoresist 22, and complete optical transparency is not required.

Figure 4:
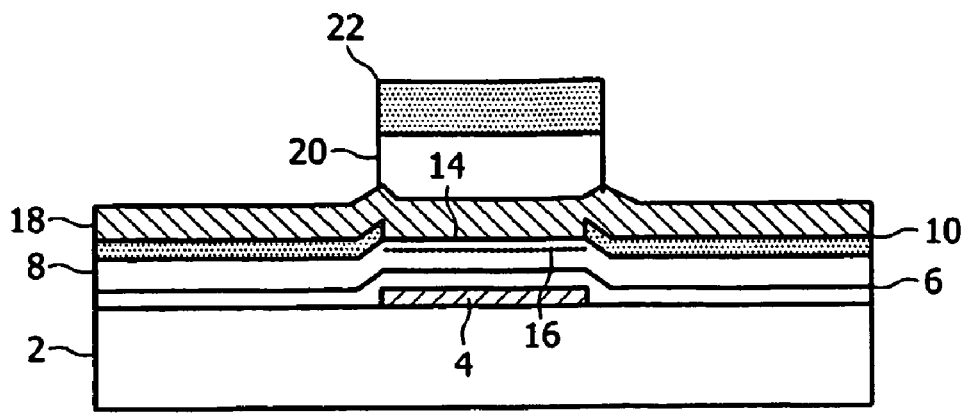
FIG. 4 is a schematic of a third step in the manufacture of a transistor according to the first embodiment of the invention.

Next, the transparent insulating layer 20 is etched using dry etching to leave vertical side walls, as shown in FIG. 4. This is followed by the deposition of a spacer forming layer 28. A further dry etch is then used to form the spacer regions 28.

Figure 5:
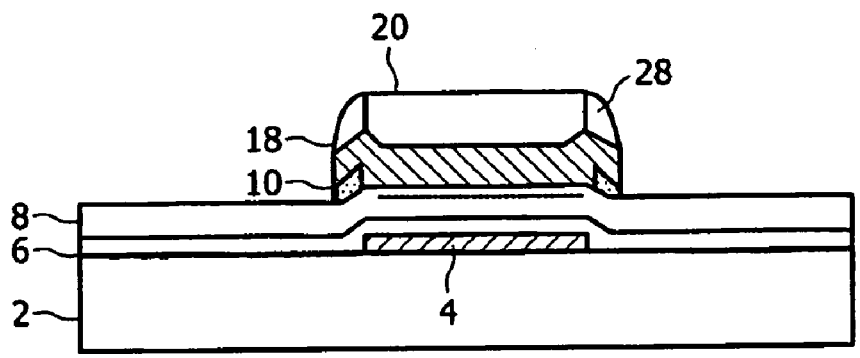
FIG. 5 is a schematic of a fourth step in the manufacture of a transistor according to the first embodiment of the invention.
Figure 6:
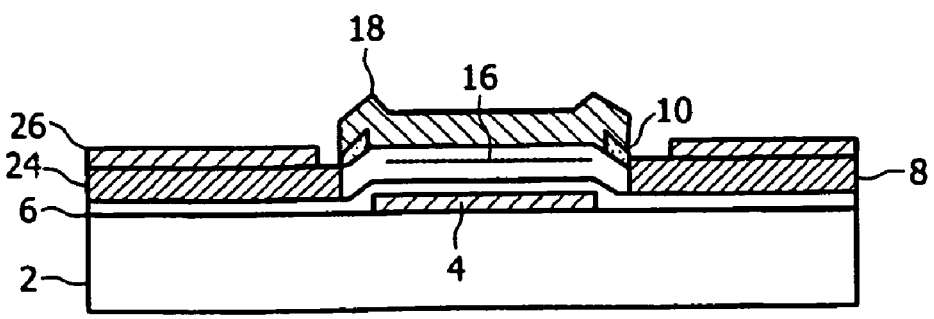
FIG. 6 is shows the transistor according to the first embodiment of the invention.

The source layer 18 and insulating layer 10 are then etched away using the spacers 28 as a mask to expose the active transistor layer 8 away from the gate 4, arriving at the structure shown in FIG. 5.

Drain regions 24 are defined in the active layer 8 by Implanting n+ dopants using the insulating spacer 28, source 18 and field plate 10 as a mask. The sacrificial layer 20 and spacers 28 are then etched away. Drain contacts 26 are then deposited to arrive at the structure shown in FIG. 6.

The part of the semiconductor layer 8 between the barrier and the drain region 24, i.e. the part under field plates 10, will be referred to as the spacer region as it is defined by spacers 28.

By using this process in which source and drain are self aligned by back-exposure using the gate as a mask and spacers, the transistor structure is self-aligned and accordingly a very small lateral gap between the drain region 24 and the barrier, i.e. a small spacer region, may be achieved, for example less than 1 µm. Although such a size may not seem small by the standards of modern single crystal semiconductor structures, it is good in the context of thin film structures which are normally deposited as large area arrays on an insulating substrate, as here. In such devices the optics required are not in general capable of achieving features sizes as low as those achievable using the self-aligned structures according to the invention. The small distance between the source 18/semiconductor 8 interface forming the barrier and the highly doped drain region 24 reduces the resistance and maximises current handling whilst minimising gate-drain capacitance by avoiding gate-drain overlap.

Field plates 10 provide for field relief at the edges of the source.

Figure 7:
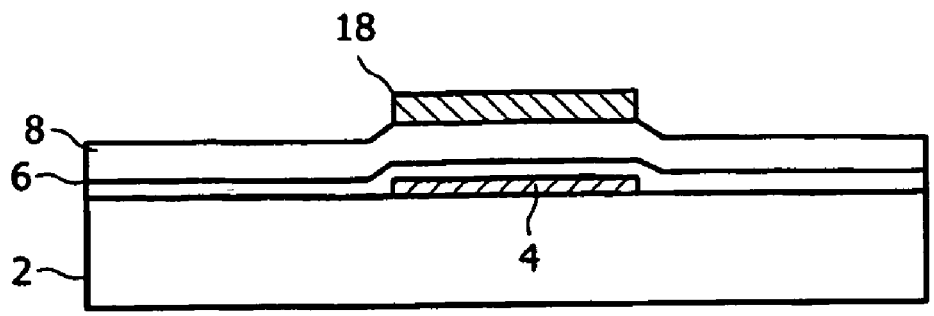
FIG. 7 is a schematic of a step in the manufacture of a transistor according to a second embodiment of the invention.
Figure 8:
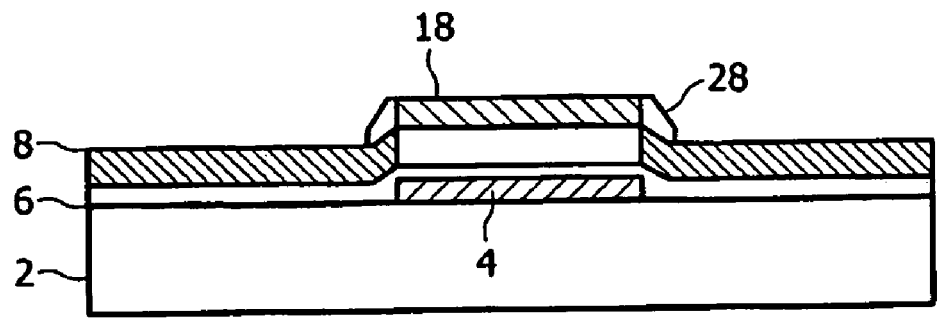
FIG. 8 is a schematic of a further step in the manufacture of a transistor according to the second embodiment of the invention.
Figure 9:
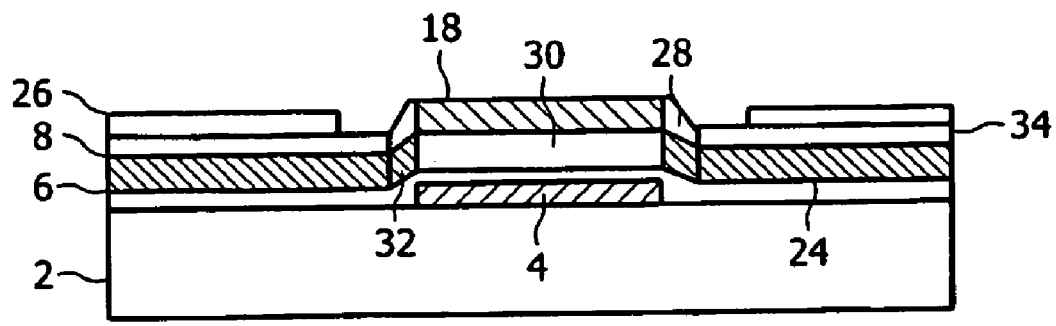
FIG. 9 shows a transistor according to the second embodiment of the invention.

FIGS. 7 to 9 show a self-aligned process for making a source-gated transistor according to a second embodiment of the invention. In this device, field relief is achieved not by using field plates as in the first embodiment but instead by providing a moderately doped n-type region between the edge of the source and the heavily doped drain region 24.

The process is the same as that in the first embodiment up to the deposition of polysilicon layer 8 (FIG. 2). Then, a transparent source layer 18 is deposited, followed by positive photoresist. This is exposed by illumination through the substrate 2 using gate layer 4 as a mask. The source layer 18 is then etched away where exposed by the photoresist, resulting in the source 18 as shown in FIG. 7.

The source 18 is used as a mask for an n implantation into the polysilicon layer 8. These steps may occur in either order, depending on the resist and implantation processes used.

Next, a thin insulating layer is deposited which is used to form an insulating spacer 28 at the edge of the source region. This is achieved by first etching the thin insulating layer using dry etching for a time sufficient to remove the thin insulating layer over the flat part of the structure. This step leaves some of the insulating layer to form the spacer at the edge of the source region where the insulating layer needs to rise over the edge of the source region. The resulting structure is shown in FIG. 8.

The spacer 28 and source 18 are then used as a mask for an n+ drain implant that defines highly doped n+ drain regions 24 in the active layer 8. A silicide layer 34 is formed over the drain regions 24. This may be achieved by depositing metal and reacting the metal with the polysilicon to form silicide. Drain contacts 26 are then formed to arrive at the structure shown in FIG. 9.

In a variation, the suicide layer 34 is omitted,

The central region 30 of semiconductor layer 8 under the source region and barrier remains undoped, and the n-doped spacer region 32 under the spacer 28 separates the drain region 24 from the central region. This spacer region 32 provides field relief. As in the first embodiment, a very small lateral spacing of less than 1 μm between the drain region 24 and the central region 30 may be achieved. The lower doping in the spacer region 32 provides field relief at the edge of the source region.

Figure 10:
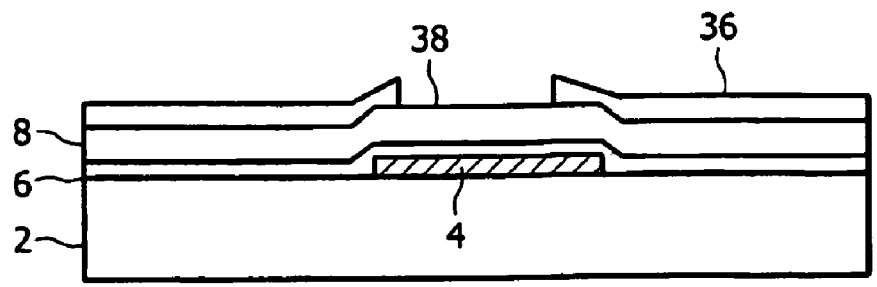
FIG. 10 is a schematic of a step in the manufacture of a transistor according to a third embodiment of the invention.
Figure 11:
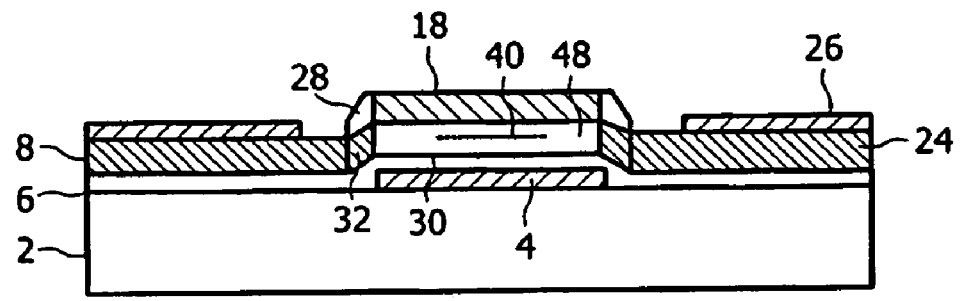
FIG. 11 shows a transistor according to the third embodiment of the invention.

FIGS. 10 and 11 illustrates a third embodiment of the invention using a third approach to field relief. In this device, a barrier lowering implant is provided inside the source contact region so that a lower effective barrier is surrounded by a higher effective barrier.

The steps used to make the third embodiment follow those of the first and second embodiments up to the deposition of semiconductor 8, which in this embodiment is amorphous silicon (a-Si:H) instead of polysilicon.

Then, a transparent sacrificial oxide layer 36 is deposited followed by negative photoresist. This is patterned using back exposure to form a window in the photoresist by over-exposing and developing the resist so that that the window is narrower than the gate 4. The resist Is then used to pattern the transparent sacrificial oxide layer 36 to have window 38 and the resist removed, as shown in FIG. 10. In alternative embodiments, the sacrificial oxide layer 36 is omitted and the window formed in the photoresist is used instead of the window 38 in sacrificial oxide layer 36 during the following steps.

The window 38 is used to deposit a barrier lowering implant 40 in the source region. The skilled person will be aware of how implants may be used to lower the height of Schottky barriers, as explained for example in U.S. Pat. No. 3,943,552 to Shannon et al. The sacrificial oxide layer 36 is etched away.

Next, the source layer 18 is deposited, followed by positive photoresist 22, and this resist is then patterned by back-exposure the gate 4 acting as a mask. The patterned photoresist 22 is then used to pattern the source 18 to be self-aligned to the gate. The source is then used as a mask for an n implant.

Processing then follows the second embodiment to provide drain regions 24, and arrives at the structure shown in FIG. 11. Note that the silcide layer 34 is omitted. As in the second embodiment, spacer regions 32 defined by spacers 28 separate the central region 30 adjacent to the source 18 from the highly doped drain regions 24. In this embodiment, the barrier is lowered by implant 40 in the central part of the central region 30 but not in edge regions 48 around the central region 30 which forms field relief regions 48. This field relief is additional to that provided by spacer region 32.

Figure 12:
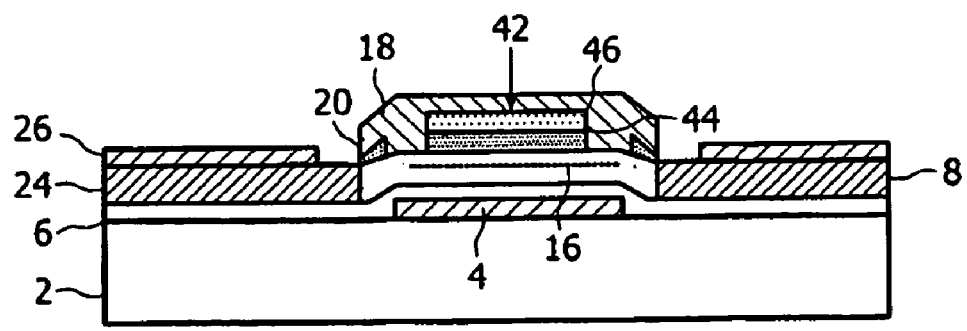
FIG. 12 shows a transistor according to a fourth embodiment of the invention.

A fourth embodiment of the invention is illustrated in FIG. 12. In this embodiment, blocking layer 42 Is provided In the central part of the source 18 to block injection in the middle of the source. This reduces parasitic source capacitance and source transit times.

A similar technique to that used in the third embodiment to pattern the implant 40 to be narrower than the gate is used in the fourth embodiment to pattern the blocking layer 42. The steps used to make the fourth embodiment follow those of the first, second and third embodiments up to the deposition of the semiconductor layer 8. Next, a transparent Insulating layer 42 is deposited—in the embodiment shown a dual layer structure of oxide 44 and nitride 46 is used. Positive photoresist is then applied, and by back-exposure using the gate as a mask the blocking region is defined in he photoresist using over-exposure of the photoresist, overetching, or both. The transparent insulating layer 42 made up of oxide 44 and nitride 46 is then removed except where protected by photoresist leaving the structure with central blocking region 42.

The photoresist is then removed and processing follows the steps of the first embodiment starting with deposition of insulating layer 10 to arrive after those steps are completed at the device of FIG. 12.

Note that the various different features in the above embodiments may be combined and incorporated in different combinations as will be appreciated by those skilled in the art. A variety of semiconductor materials may be used.

Further, note that although the embodiments described include two-sided arrangements in which a pair of drain regions surround a single source the skilled person will appreciate that single-sided arrangements with a single drain arranged adjacent to a single source are also possible. The two-sided arrangement can however often offer higher current flow.

Further, a separate barrier layer may be used instead of using a Schottky barrier.

The materials of the substrate, and the various layers deposited on the is substrate may be replaced by equivalents as will be apparent to the skilled person.

The invention claimed is:

1. A method of manufacturing a source-gated transistor, including:
    (a) providing a transparent substrate;
    (b) depositing a gate layer and patterning the gate layer to form a gate;
    (c) depositing a gate insulating layer;

(d) depositing a thin film semiconductor layer;

(e) depositing a transparent source layer defining a barrier with the semiconductor layer, using a step of back exposure through the substrate using the gate as a mask to define the barrier between source layer and the semiconductor layer;

(f) depositing a positive photoresist layer;

(g) exposing the positive photoresist layer through the transparent substrate and source layer using the gate as a mask to pattern the photoresist in self-alignment with the gate;

(h) etching the transparent source layer to form a source region using the pattern defined directly or indirectly by the photoresist layer;

(i) forming spacers at the edge of the source region; and (j) implanting dopants into drain regions of the semiconductor layer using the source region and spacers as a mask to form highly doped drain regions spaced from the source region by the width of the spacers.

2. A method according to claim 1, further comprising:

defining a drain region in the semiconductor layer in contact with a drain contact;

wherein spacers are used to define the lateral extent of a spacer region of the semiconductor layer in registration with the gate using a self-aligned process, the spacer region being the region between the drain region and the barrier.

3. A method according to claim 1, further comprising the step of defining at least one field relief region at the edge of the source region in registration with the gate using a self-aligned back exposure process, wherein the field relief region is patterned using photoresist on the top of the substrate exposed with illumination passing through the substrate using the gate as a mask.

4. A method according to claim 1, further comprising, after step (d):

depositing an insulating layer and etching the insulating layer to form a source window in alignment with the mask.

5. A method according to claim 1, further comprising:

depositing a transparent sacrifical layer on the transparent source layer before carrying out steps of depositing and patterning the positive photoresist layer;

after carrying out step (g), forming spacers on the sidewalls of the transparent sacrificial layer so that the spacers and transparent sacrificial layer are together wider than the gate; and using the transparent sacrificial layer and spacers as a mask to etch the source layer and the underlying insulating layer to leave the source layer extending over a region wider than the gate and to form the insulating layer to define a field plate spacer between the source layer and the semiconductor layer.

6. A method according to claim 1 wherein step (i) of forming spacers is carried out after the step (h) of forming the source region so that the spacers are formed on the edges of the source region.

7. A method according to any of claim 1, further comprising performing an implant into the semiconductor layer after step (h) of forming the source region to form a doped region of the semiconductor layer in alignment with the source region.

8. A method according to claim 1, further comprising depositing a barrier-lowering implant in the semiconductor layer.

9. A method according to claim 8 wherein the barrier lowering implant is self-aligned to the gate but implanted over a narrower area than the area of the gate defining a field relief region of the central region around the barrier lowering implant which is not implanted with the barrier lowering implant.

10. A method according to claim 1, further comprising depositing a transparent insulating layer in the central region at the centre of the barrier between the source region and semiconductor layer.

* * * * *